(12) United States Patent
Smith (10) Patent No.: US 7,170,588 B2
(45) Date of Patent: Jan. 30, 2007

(54) REDUCTION SMITH-TALBOT INTERFEROMETER PRISM FOR MICROPATTERNING

(76) Inventor: Bruce W. Smith, 22 Mt. Eagle Dr., Penfield, NY (US) 14526

( * ) Notice: Subject to any disclaimer, the term of this patent is extended or adjusted under 35 U.S.C. 154(b) by 0 days.

(21) Appl. No.: 10/898,677

(22) Filed: Jul. 23, 2004

(65) Prior Publication Data

US 2005/0057735 A1  Mar. 17, 2005

Related U.S. Application Data

(60) Provisional application No. 60/490,294, filed on Jul. 25, 2003.

(51) Int. Cl.
*G03B 27/52* (2006.01)
*G03B 27/42* (2006.01)
*G03B 27/54* (2006.01)

(52) U.S. Cl. ............... 355/71; 355/53; 355/67

(58) Field of Classification Search .......... 355/52, 355/53, 55, 67–71
See application file for complete search history.

(56) References Cited

U.S. PATENT DOCUMENTS

| | | | | |
|---|---|---|---|---|
| 5,359,388 A | * | 10/1994 | Hollman | 355/53 |
| 6,094,305 A | * | 7/2000 | Shiraishi | 359/558 |
| 6,118,516 A | * | 9/2000 | Irie et al. | 355/53 |
| 6,304,318 B1 | * | 10/2001 | Matsumoto | 355/55 |
| 6,411,367 B1 | * | 6/2002 | Baker et al. | 355/67 |
| 6,627,356 B2 | * | 9/2003 | Kawamura et al. | 430/5 |
| 6,870,668 B2 | * | 3/2005 | Ozawa | 359/352 |

* cited by examiner

*Primary Examiner*—Henry Hung Nguyen
(74) *Attorney, Agent, or Firm*—Thomas R. FitzGerald, Esq.; Hiscock & Barclay, LLP (57) ABSTRACT

Reduction Talbot interference imaging is carried out using a glass or fused silica prism, where at least two surfaces within the prism allow for an increase in the propagating ray angles at the image plane compared to the object (the photomask) plane. Furthermore, by adding a second orthogonal pair of surfaces, X and Y order recombination is made possible thus allowing for the imaging in an orthogonal direction with a two-order interference scheme as well as repeating checkerboard (island and hole) patterns with a four-order interference scheme. A benefit of the invention is the reduced requirements of the photo mask, allowing for diffraction limited imaging with UV wavelengths in a media with index of unity (air) or larger (an immersion fluid). The prism interferometer is known as a Smith-Talbot prism lens.

25 Claims, 7 Drawing Sheets

REDUCTION SMITH-TALBOT INTERFEROMETER PRISM FOR MICROPATTERNING

CROSS-REFERENCE TO RELATED APPLICATIONS

This application claims the benefit of the filing date of U.S. Provisional patent application Ser. No. 60/490,294 filed Jul. 25, 2003.

FIELD OF INVENTION

The invention relates to the imaging systems used in a variety of applications, including microlithography, photo-ablation, fabrication of Bragg gratings, ultraviolet (UV) inspection, and mastering of optical data storage media.

BACKGROUND OF THE INVENTION

Figure 1:
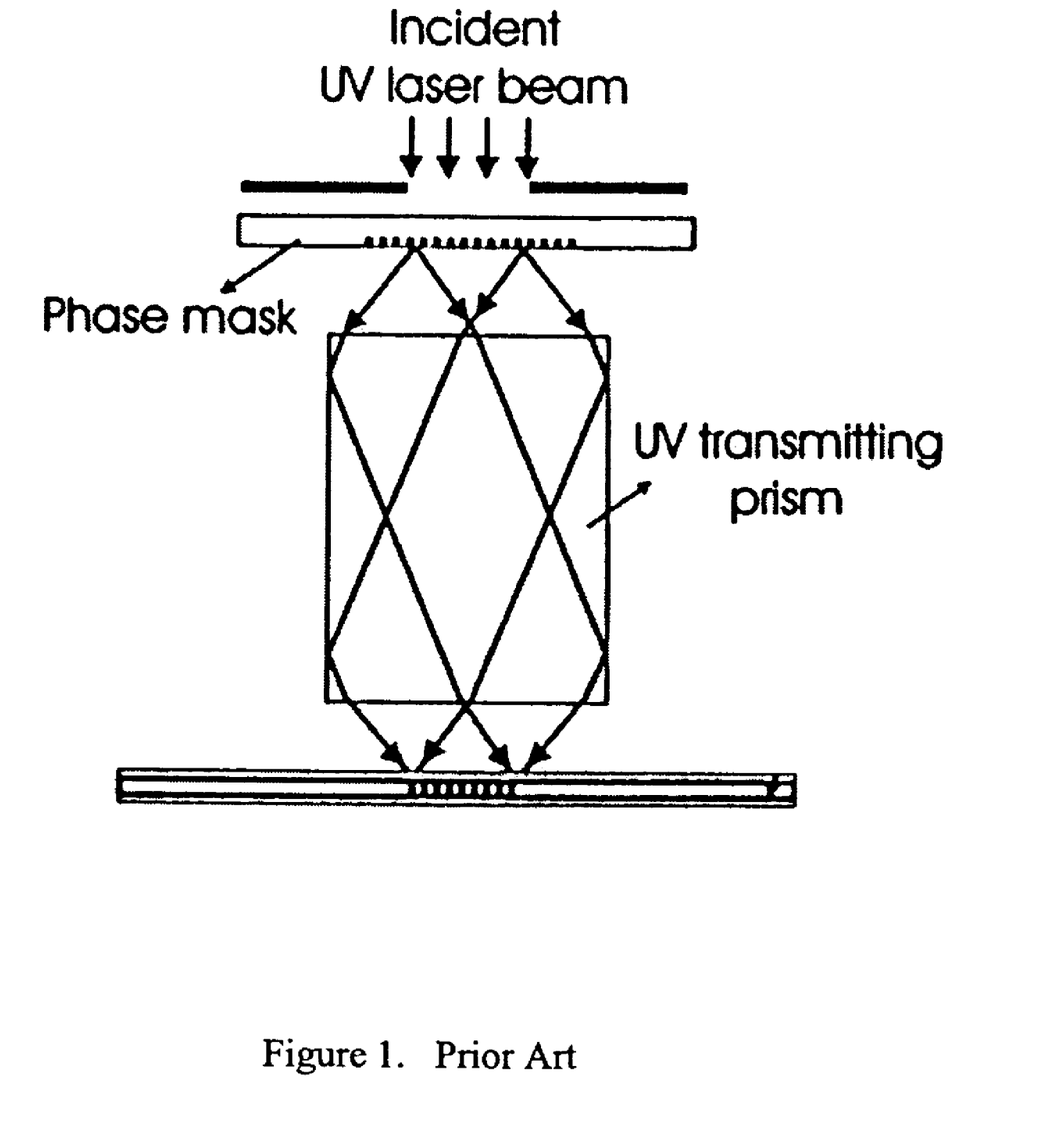
FIG. 1 is a prior art drawing of a Talbot interference prism.

Prior art systems for high resolution imaging applications utilize an illumination system, an object (a photomask), an objective lens, and an image plane. When an application is limited to the generation of repetitive patterns, interferometric approaches can be substituted and the system components can be limited to an illumination system, a phase object, a method of recombination, and an image plane. Common approaches for printing such patterns are interferometric methods and phase-mask methods. In the former technique, a single laser beam is split into two components, which are subsequently recombined at the image plane to produce an interference pattern. In the latter, a phase mask is used to diffract a laser beam mainly into two first orders. Interference between the two first orders creates the required pattern at the image plane. The two-beam interferometric method has the advantage that the period of the interference pattern may be tuned to produce gratings that operate over a wide range of wave-lengths, but requires a high stability and alignment, whereas the phase-mask method is relatively insensitive to vibration and alignment but lacks the flexibility to select the image grating pitch. In conventional phase-mask technique alignment, tolerances can be demanding due to the presence of diffraction orders other than +/−1. This can be overcome by incorporating the phase mask into a Talbot interferometer (see for instance Talbot, Phil. Mag. and Journ. vol. 9, p. 401, 1836; Rayleigh, Phil. Mag. vol. 11, p. 196, 1881 and P. E. Dyer, R. J. Farley, and R. Giedl, "Analysis of a 0/1 order Talbot interferometer for 193 nm laser grating formation," Opt. Commun., vol. 129, pp. 98–108, 1996.) A variation to the phase-mask scheme based on a UV transmitting fused silica prism has been described where the +1 and −1 diffraction orders are internally reflected within a rectangular prism shown in FIG. 1 and interfere at the image plane (see for example A. Othonos "Fiber Bragg Gratings," Rev. Sci. Instrum. 68 (12), 4309–4341 1997). Such an approach is limited to situations where grating images are desired with periods that are one half as that on the available mask (for a +/−1 Talbot interferometer) or the same as that on the available mask (for a 0/1 Talbot interferometer described for example in P. E. Dyer, R. J. Farley, R. Giedel "Analysis and application of a 0/1 order Talbot interferometer for 193 nm laser grating formation," Opt. Comm., 129, 98–108, 1996). The limited availability of phase masks with gratings pitch values less than 500 nm, and the quality of such masks near 500 nm, limits these approaches to image resolution above 250 nm pitch values. To achieve resolution approaching the diffraction limits of UV wavelengths (such as the 248 nm, 193 nm, or 157 nm wavelengths from excimer lasers) the Talbot interferometer approaches using fused silica prisms such as that shown in FIG. 1 would require a phase mask with a difficult grating pitch near 200 nm (which would result in an image grating pitch near 100 nm). It is also possible to extend resolution by using immersion imaging methods. By placing an immersion fluid with index larger than unity between an optical system and an image plane, propagation angles larger than those allowed in air can be collected. The implication to the prior art Talbot interferometer of FIG. 1 is a phase mask requirement with pitch value below 170 nm, representing significant constraints as the mask dimensions are sub-wavelength, reducing the efficiency of the phase shifting structure. The result is not practical.

SUMMARY OF THE INVENTION

I have achieved superior optical imaging performance in an interferometric imaging system through the use of a prism to recombine mask diffraction orders, whereas the recombination results in image patterns with a pitch less than half of that on the photomask object. The prism utilizes Talbot interference at angles greater than those produced as the photomask. resulting in a reduction factor greater than unity (and a magnification factor less than unity). Accordingly, various embodiments of the present invention are directed to optical imaging systems and methods which utilize a photomask for the creation of diffraction orders and a prism to produce interference of said diffraction orders to form patterns onto a recording plane, where a photosensitized substrate is positioned. The image at the image plane prints with a pitch smaller than half of the pitch of the mask pattern. A major advantage of the invention is the ability to image very high resolution geometry without limitations of the photomask. Additionally, in the exemplary embodiments, I employ the use of immersion imaging to extend the resolution of the invention for angles corresponding to numerical apertures greater than 1.0.

DETAILED DESCRIPTION OF THE INVENTION

Nanotechnology, photonics and semiconductor lithography need research tools for investigating submicron imaging. For example, semiconductor lithography companies are designing immersion optical lithography equipment for imaging submicron geometries. Such machines are complex, expensive and are not yet available. As such, material suppliers of photoresist and other supplies are at a disadvantage. They need a development tool for imaging submicron features, but constructing a development immersion lithography tool would be prohibitively expensive. This has created an unmet need for submicron development tools that allow research and development of systems and supplies. I have discovered an apparatus and method for imaging submicron features that would allow suppliers to test their materials and systems on submicron images. My invention uses modified Talbot interference imaging to reduce Talbot images to submicron geometries. It enables imaging of features in the X direction or the Y direction to provide lines and spaces, or in the X and Y direction to provide a checkerboard pattern similar to contact vias in semiconductor lithography.

Reduction Talbot interference imaging is carried out using a glass or fused silica prism, where at least two surfaces within the prism allow for an increase in the propagating ray angles at the image plane compared to the object (the photomask) plane. Furthermore, by adding a second orthogonal pair of surfaces, X and Y order recombination is made possible thus allowing for the imaging in an orthogonal direction with a two-order interference scheme as well as repeating checkerboard (island and hole) patterns with a four-order interference scheme. A benefit of the invention is the reduced requirements of the photo mask, allowing for diffraction limited imaging with UV wavelengths in a media with index of unity (air) or larger (an immersion fluid). The prism interferometer is known as a Smith-Talbot prism lens.

First Embodiment of the Invention

Figure 2:
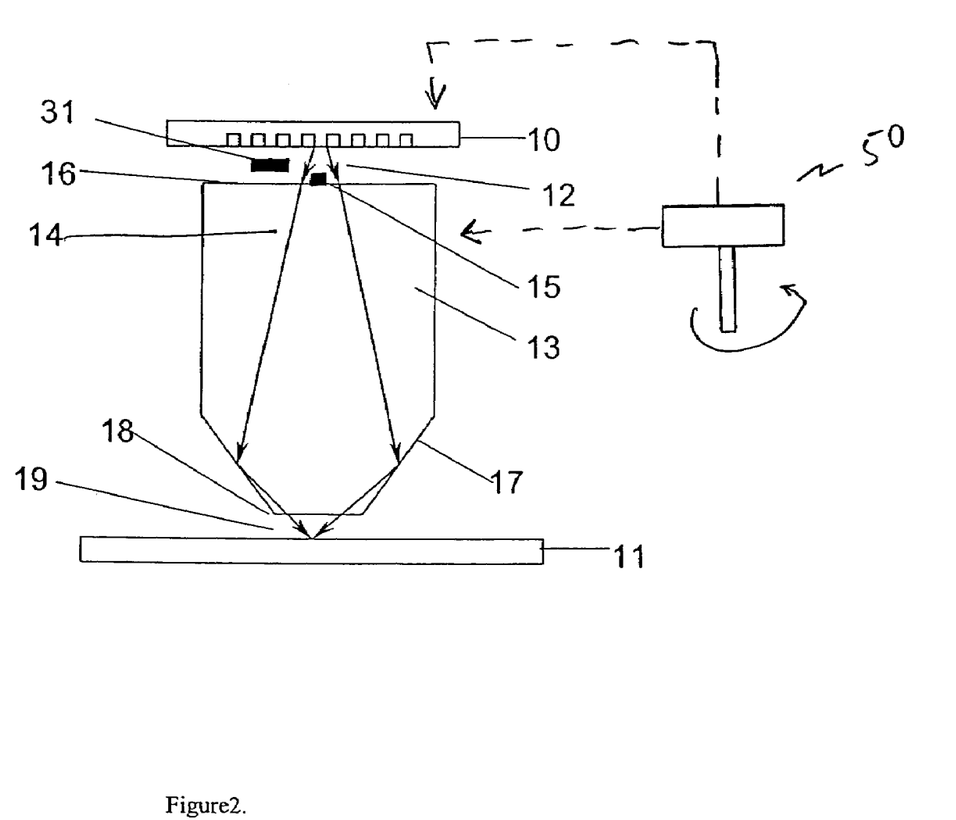
FIG. 2 is a drawing of an embodiment of the Smith-Talbot prism lens with one pair of internally reflecting faces.

With reference to FIG. 2, the first embodiment of the invention is the simplest form. This example, however, does not limit the invention in any way. A grating photomask (10) is illuminated with radiation of wavelength (lambda) in the ultraviolet (UV) or visible spectrum, corresponding to the sensitivity requirement of the sensitized substrate at the imaging plane (11). The photomask is comprised of a metallic film deposited and patterned onto a glass substrate. The irradiation of the photomask (10) results in a diffraction pattern (12), where diffraction order beams are directed symmetrically toward a prism lens (13). The central diffraction order beam (14) is blocked by an obscuration (15), which can be a small metal plate placed between the photomask and the prism lens. Alternatively, the photomask (10) is a phase grating mask, comprised of a grating patterned directly into a glass substrate with patterns etched to a depth of lambda/[2(n−1)], where the central diffraction order beam is suppressed. The path of the radiation from the diffraction order beams then enters the prism lens at the first surface (16) where the diffraction angle is modified according to Snell's law:

$$n(1) \times \sin(theta1) = n(2) \times \sin(theta2)$$

and the refractive index n (1) is that of the media of diffraction, where the value for air is 1.0 and n(2) is the refractive index of the prism material, where for example, the value for fused silica is 1.56 for a wavelength of 193 nm. The first surface of the prism (16) may be coated with an anti-reflective layer such as magnesium fluoride to reduce reflection artifacts. The radiation from the diffraction order beams is then directed toward the reflective facets of the prism (17), which are coated on the outermost surface with a reflective thin film coating, such as aluminum, chromium, or amorphous silicon, to act as mirror surfaces. The angle of the mirrored facets directs the path of the beams to recombine at a position outside of the prism at the last surface (18), where the recombination causes interference and a sinusoidal intensity distribution with the pitch (P) corresponding to:

$$P = lambda/(2 \times n' \times \sin(theta'))$$

where n' and theta' are the refractive index and refraction angle of the media outside of the prism last surface (19) and the numerical aperture (NA) is defined as the product [n'×sin(theta')]. In the exemplary embodiment, this media is air or a fluid. If the media is air, the refractive index is 1.0. If the media is a fluid, the refractive index is that for the fluid at the wavelength of radiation (lambda). For media with refractive index greater than 1.0, the value of the NA product [n'×sin(theta')] can be greater than 1.0, which results in smaller pitch values (P) than with air as the outside media.

Second Embodiment of the Invention

Figure 3:
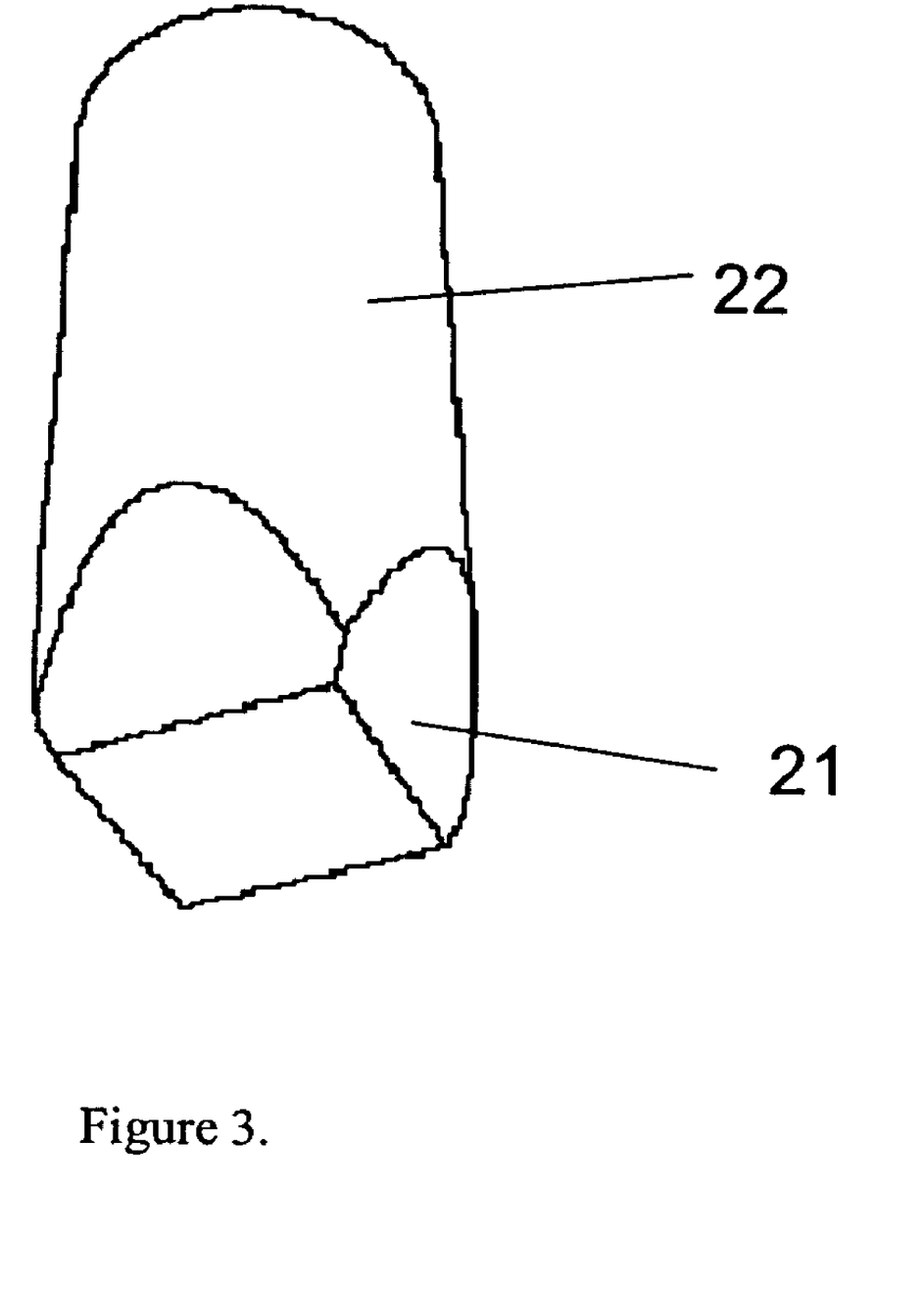
FIG. 3 is a drawing of a Smith-Talbot prism lens with two pairs of internally reflecting faces.

A second embodiment of the invention is shown in FIG. 3. This embodiment is the four facet Smith-Talbot prism lens. This embodiment allows for either one or two pairs of diffraction order recombination. The radiation path from the diffraction order beams is directed toward four reflective facets (21) of the four facet prism lens (22), which are coated on the outermost surface with a reflective thin film coating, such as aluminum, chromium, or amorphous silicon, to act as mirror surfaces. The four facets (21) of the present embodiment allow for the creation of sinusoidal intensity patterns in orthogonal directions, either independently in separate imaging steps or together in one imaging step. By changing the orientation of the photomask by an angle of 90 degrees, the path of radiation from the resulting diffraction orders is directed from one parallel set of mirrored facets to the second orthogonal set. This allows for imaging of either horizontal (X) or vertical (Y) features onto the image plane. In addition, by using a photomask with features patterned or etched in orthogonal directions, (in a checkerboard fashion for instance), four diffraction orders are created. These four orders of radiation are directed along a path through the prism and reflected from the four facets at once, producing orthogonal two directional sinusoidal interference patterns with pitch also the orthogonal axes (P) corresponding to:

$$P = lambda/(2 \times n' \times \sin(theta'))$$

Where n' and theta' are the refractive index and refraction angle of the media outside of the prism last surface.

Figure 4:
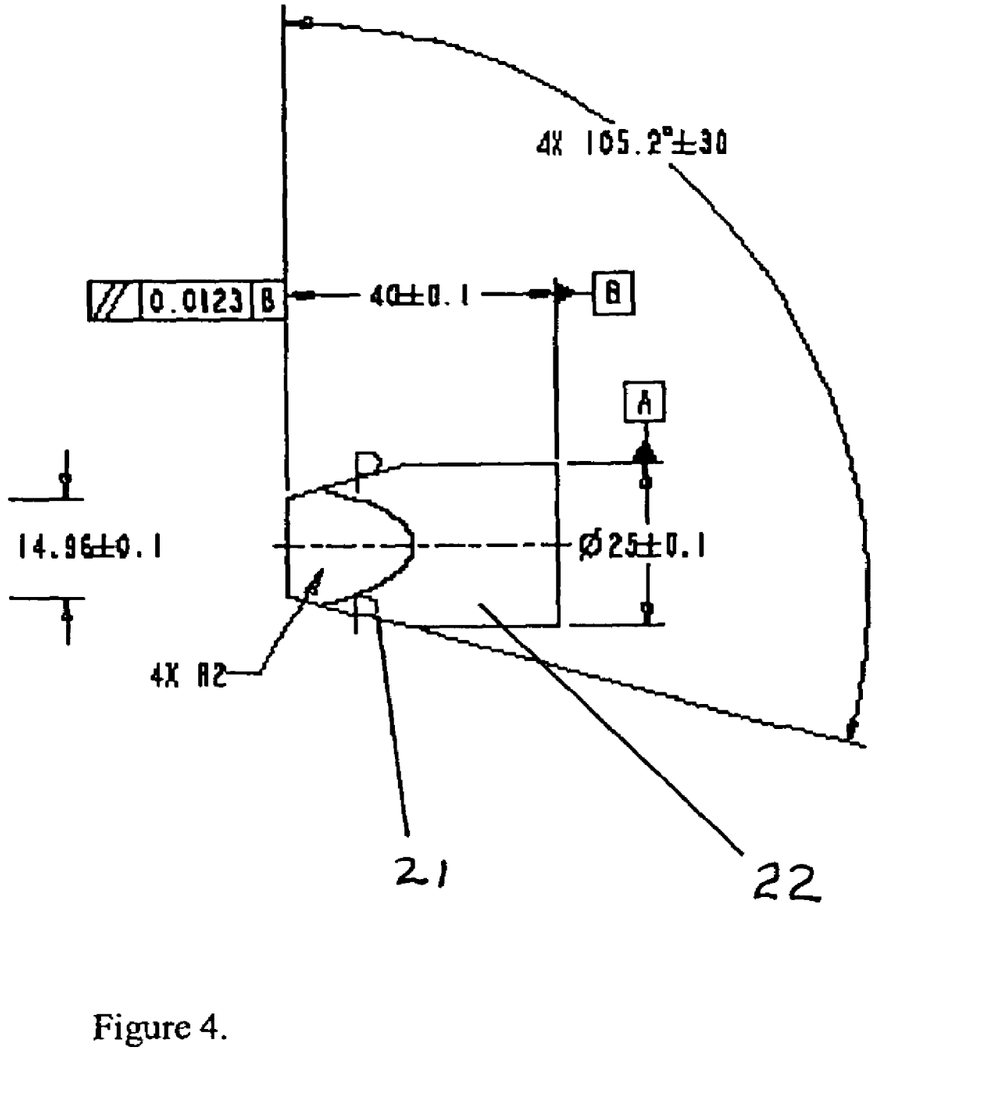
FIG. 4 is a 1.05 NA Smith-Talbot prism lens.
Figure 5:
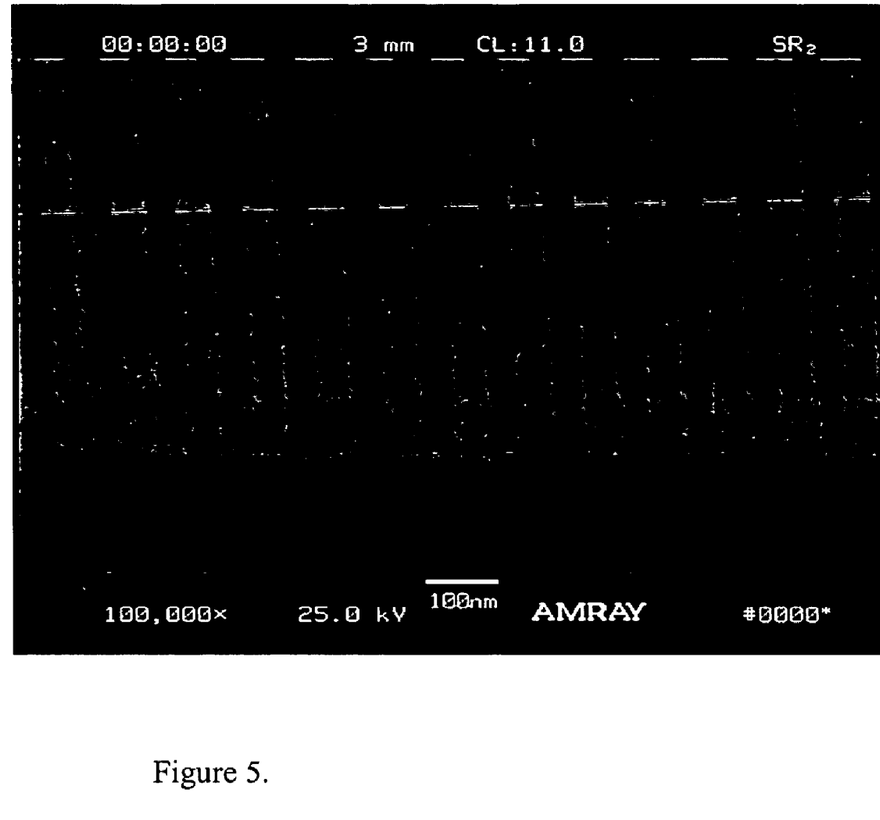
FIG. 5 shows photoresist images using a 1.05 NA Smith-Talbot prism lens of FIG. 4.

As an example of the this embodiment of the invention, a Smith-Talbot prism lens of FIG. 4 was fabricated from fused silica with facets angled at 105.2 degrees, polished, and coated with aluminum and chromium and used with a 600 nm pitch photomask, placed at the a separation of 10 mm from the first side of the prism. The first surface of the prism was coated with a magnesium fluoride anti-reflective layer. First diffraction orders from the phase grating are directed toward the image plane at a numerical aperture (NA) in fused silica of 0.73. A 0.5 mm meniscus of water is held between the image plane and the last prism surface, resulting in an effective immersion numerical aperture of 1.05 or a resist image pitch of 90 nm. An argon-fluoride (ArF) 193 nm excimer was modified to the specifications required for the present invention. The employment of extra-cavity spatial and temporal filtering allowed for output of an excimer laser to operate with high temporal and spatial coherence. FIG. 5 shows image results from a 1.05 NA Smith-Talbot prism lens with an ArF excimer laser operating with a temporal coherence bandwidth or 10 pm and a spatial coherence length of 2.5 mm. The prism lens NA is 1.05. Features are 45 nm lines and spaces imaged in a 70 nm photoresist thickness.

Third Embodiment

Figure 6:
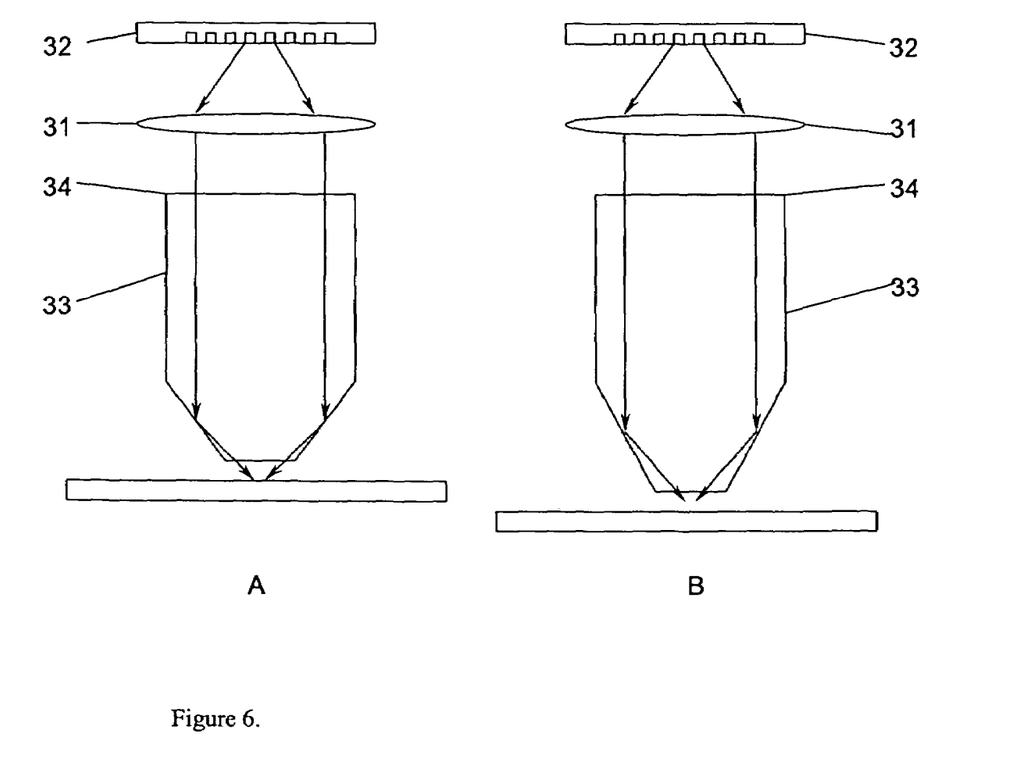
FIG. 6 is a drawing of a four facet Smith-Talbot prism lens with two facet angles.

Another way in which the present invention can exist is as a four facet prism lens, where the two pairs of orthogonal facets not at identical angles. The significant benefit of this embodiment is the ability to produce two different pitch values with a single prism lens. With reference to FIG. 6, a lens (31) is used between the photomask (32) and the Smith-Talbot prism lens (33) to collimate the diffraction order beams from the photomask so that they are normal to the first surface (34) of the prism lens. FIG. 5a is one orientation (A) of the prism lens and FIG. 5b is the other orientation (B). Beams that pass through the lens and are reflected off of facets in orientation A are interfered to produce a pitch:

$$P=\text{lambda}/(2 \times n' \times \sin(\text{theta}A))$$

where sin(theta) is the interfering beam angle resulting from the facet angle in the prism. Beams that pass through the lens and are reflected off of facets in orientation B are interfered to produce a pitch:

$$P=\text{lambda}/(2 \times n' \times \sin(\text{theta}B)).$$

By rotating the prism lens or the mask with any conventional rotating means such as a rotating optical mount 50, either pitch value can be imaged with the single lens.

Forth Embodiment

Figure 7:
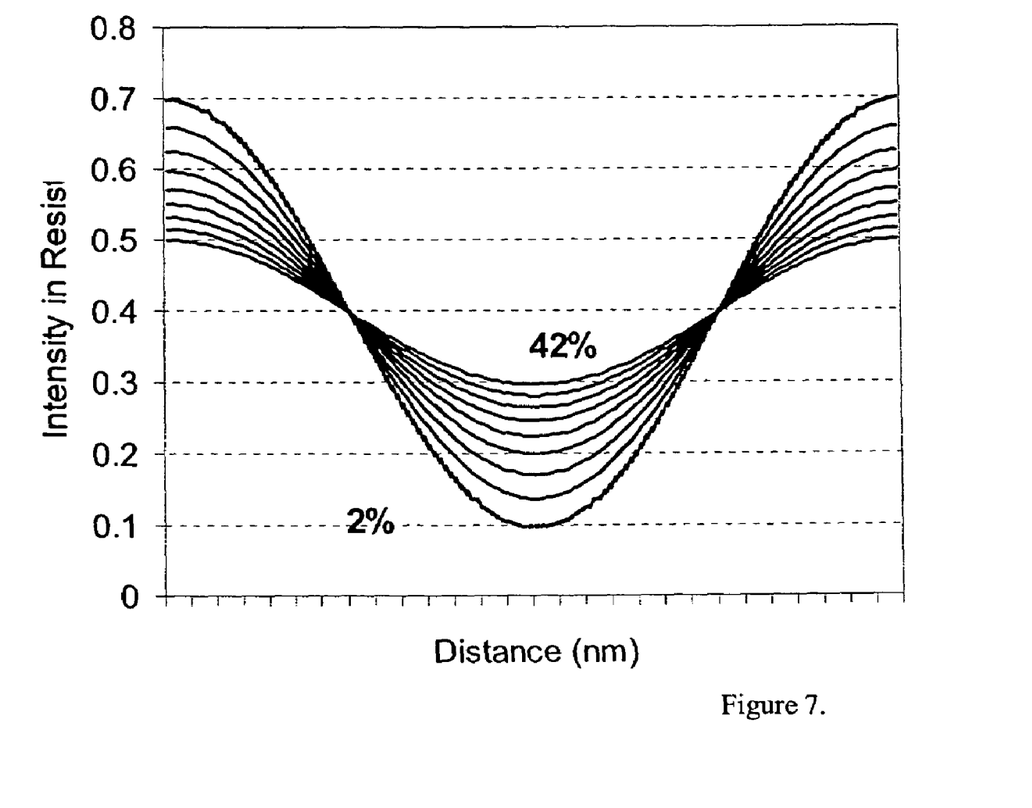
FIG. 7 shows demodulation of imaging using an attenuated single beam.

I have discovered that the reduction of the modulation of the sinusoidal interference patterns with pitch (P) corresponding to:

$$P=\text{lambda}/(2 \times n' \times \sin(\text{theta}'))$$

resulting from the present invention can be accomplished through the control of the individual diffraction order beams of radiation in the prism lens. The method employed involves the attenuation of all diffraction beams except one single order beam. This results in an image with no sinusoidal interference. In FIG. 2, for example, a beam blocker (31) is placed in the path of one diffraction order beam during part of the exposure. When an exposure from such a single diffraction order beam is added to that from multiple interfering beams, the resulting sinusoidal intensity pattern exhibits a reduction in modulation. The effect is a demodulation that can used to produce varying degrees of image quality. FIG. 7 shows the result of imaging 100 nm lines and spaces in a photoresist with a single beam exposure between 2% and 42% (corresponding to a two beam exposure between 98% and 58%). The result is a distribution of intensity into the photoresist that approximates that which would be encountered if imaging was carried out using with a defocus between 0 and 240 nm in a lithography system comprising a 0.75 NA using annular illumination. This significant result of this invention is the ability to produce exposure effects that mimic those from projection imaging with a full circular lens. This is important when the present invention is used to predict the imaging performance of a projection imaging system.

Those skilled in the art understand that the embodiment of FIG. 4 may be practiced with or without the prism 13. In other words, other means may be used to select one of the diffraction orders. Regardless of the means used to select the order, the blockage 31 still performs its intended function of defocusing the projected image.

I claim:

1. An optical imaging system comprising:
    a diffracting photomask to direct one or more beams of illumination toward a transmitting interference prism;
    a transmitting interference prism comprising a refractive material with an index of refraction greater than air and one or more surfaces disposed at the boundary between the refractive material and air or other refractive media;
    wherein said prism further comprises a beam entry surface positioned after the diffracting photomask and a beam exit surface positioned before an imaging media, wherein said entry and exit surfaces are in parallel planes, disposed transverse to the beam path, and spaced apart by said refractive material with an index of refraction greater than air; and one or more pairs of internally reflecting surfaces disposed in planes that intersect both the entry and exit surfaces, and form supplementary angles at the intersect to the exit surface for recombining the beams;
    said imaging media with a refractive index greater than unity;
    an imaging plane and a photosensitive material to record an incident image; and
    an exposing source to illuminate the diffracting photomask.

2. The system of claim 1 wherein the transmitting interference prism comprises a plurality of pairs of internally reflecting surfaces wherein the members of each pair are opposite each other.

3. The system of claim 2 wherein the rotational axes of the pairs are orthogonal to each other.

4. The system of claim 2 wherein the rotational axes of the pairs are parallel to each other.

5. The system of claim 2 wherein the angles of the pairs of surfaces are the same.

6. The system of claim 2 wherein the angles of the pairs of surfaces are different.

7. The system of claim 1 further comprising a means for moving the prism with respect to the diffracting photomask in order to direct beams toward the internally reflecting surfaces.

8. The system of claim 1 further comprising a collimating lens disposed between the photomask and the prism.

9. The system of claim 1 further comprising a means for rotating the prism with respect to the diffracting photomask in order to separately image in orthogonal directions.

10. The system of claim 1 further comprising means for blocking one or more diffraction order beams to modulate the intensity of exposure of the image on the image plane.

11. The system of claim 1 wherein the photosensitive material is photoresist.

12. The system of claim 1 wherein the exposing source is a laser.

13. An optical system comprising:
    means for diffracting an image and transmitting one or more orders of diffraction toward a transmitting interference prism, said prism comprising a refractive material with an index of refraction greater than air and one or more surfaces disposed at a boundary between the refractive material of the prism and air or other material adjacent the prism;
    means for selecting one or more of the orders for imaging into a media;
    an imaging plane and a photosensitive material to record an incident image;
    a refractive media disposed between the transmitting interference prism and the imaging plane; and
    means for illuminating the said means for diffracting.

14. The system of claim 13 wherein the means for selecting is a transmitting interference prism comprising a first surface positioned after the means for diffracting, one or more pairs of internally reflecting surfaces for recombining the diffraction orders at angles greater than the angles at the first prism surface and a last surface at the boundary between the prism and air or other refractive media.

15. An optical imaging system comprising:
a diffracting photomask to direct one or more beams toward a transmitting interference prism;
means for selecting one or more of the beams for imaging into an image media;
said image media with a uniform refractive index greater than unity;
an imaging plane and a photosensitive material to record an incident image;
means for blocking one or more beams to modulate the intensity of exposure of the image on the image plane; and
a source of radiation to illuminate the diffracting photomask.

16. An optical imaging system comprising:
a diffracting photomask to direct one or more beams toward a transmitting interference prism, said prism comprising a refractive material with an index of refraction greater than air and one or more surfaces disposed at the boundary between the refractive material of the prism and air or other adjacent media;
means for selecting one or more of the beams for imaging into an image media;
said image media with a refractive index of unity or greater;
an imaging plane and a photosensitive material to record an incident image;
means for blocking one or more beams to modulate the intensity of exposure of the image on the image plane; and
a source of radiation to illuminate the diffracting photomask.

17. The system of claim 15 wherein the beams are diffraction orders.

18. The system of claim 15 wherein the photosensitive material is a photoresist.

19. A method of imaging comprising the steps of:
diffracting an image and transmitting one or more orders of diffraction toward a transmitting interference prism, said prism comprising a refractive material with an index of refraction greater than air and one or more surfaces disposed at the boundary between the refractive material of the prism and air or other adjacent material;
selecting one or more of the orders for imaging into a media; and
proving an imaging plane and a photosensitive material to record an incident image.

20. The method of claim 19, further comprising a step of depositing a photoresist layer at the image plane for recording said image in the photoresist.

21. The method of claim 19 further comprising the step of blocking one or more of the orders of diffraction.

22. The method of claim 19 comprising the further step of rotating the selecting means to image orthogonal features.

23. The system of claim 1 wherein said refractive material is glass.

24. The system of claim 1 wherein said refractive material is fused silica.

25. The system of claim 1 wherein said refractive material has an index of refraction greater than or equal to 1.56.

* * * * *